(12) United States Patent
Yu et al.

(10) Patent No.: US 9,245,863 B2
(45) Date of Patent: Jan. 26, 2016

(54) SEMICONDUCTOR PACKAGING APPARATUS FORMED FROM SEMICONDUCTOR PACKAGE INCLUDING FIRST AND SECOND SOLDER BALLS HAVING DIFFERENT HEIGHTS

(71) Applicant: Samsung Electronics Co., Ltd., Suwon-si, Gyeonggi-do (KR)

(72) Inventors: Hae-jung Yu, Seoul (KR); Hak-kyoon Byun, Hwaseong-si (KR); Kyung-tae Na, Hwaseong-si (KR); Seung-hun Han, Asan-si (KR); Tae-sung Park, Cheonan-si (KR); Choong-bin Yim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 13/943,037

(22) Filed: Jul. 16, 2013

(65) Prior Publication Data

US 2014/0091463 A1 Apr. 3, 2014

(30) Foreign Application Priority Data

Sep. 28, 2012 (KR) ........................ 10-2012-0109258

(51) Int. Cl.
*H01L 23/48* (2006.01)
*H01L 23/52* (2006.01)
(Continued)

(52) U.S. Cl.
CPC .......... *H01L 24/14* (2013.01); *H01L 23/49816* (2013.01); *H01L 23/49838* (2013.01); *H01L 25/105* (2013.01); *H01L 23/145* (2013.01); *H01L 2224/32145* (2013.01); *H01L 2224/32225* (2013.01); *H01L 2224/48227* (2013.01); *H01L 2224/73265* (2013.01);
(Continued)

(58) Field of Classification Search
CPC ..... H01L 24/14; H01L 23/145; H01L 25/105; H01L 23/49816; H01L 23/49838; H01L 2225/1023; H01L 2224/73265; H01L 2924/3511; H01L 2225/1058; H01L 2225/06562; H01L 2924/15331; H01L 2224/48227; H01L 2224/32225; H01L 2224/32145
USPC ......... 257/738, 733, 737, 773, 774, 778, 782, 257/786, 731, 730
See application file for complete search history.

(56) References Cited

U.S. PATENT DOCUMENTS 5,828,128 A 10/1998 Higashiguchi et al.
7,259,451 B2 * 8/2007 Seng et al. .................... 257/686
(Continued)

FOREIGN PATENT DOCUMENTS

JP 06-006009 1/1994
JP 09-102497 4/1997
(Continued)

*Primary Examiner* — A. Sefer
*Assistant Examiner* — Dilinh Nguyen
(74) *Attorney, Agent, or Firm* — Harness, Dickey & Pierce, P.L.C.

(57) ABSTRACT

According to example embodiments of inventive concepts, a semiconductor package apparatus includes a first semiconductor package including a first substrate, a first solder resist layer on the first substrate, and a first sealing member that covers and protects the first solder resist layer, and a plurality of solder balls on the first substrate. The plurality of solder balls includes a first solder ball having a first height and a second solder ball having a second height that is different from the first height. The first sealing member includes holes that expose the solder balls.

13 Claims, 14 Drawing Sheets

(51) Int. Cl.
*H01L 29/40* (2006.01)
*H01L 23/12* (2006.01)
*H01L 23/04* (2006.01)
*H01L 23/00* (2006.01)
*H01L 23/498* (2006.01)
*H01L 25/10* (2006.01)
*H01L 23/14* (2006.01)

(52) U.S. Cl.
CPC .................. *H01L 2225/0651* (2013.01); *H01L 2225/06562* (2013.01); *H01L 2225/1023* (2013.01); *H01L 2225/1058* (2013.01); *H01L 2924/15311* (2013.01); *H01L 2924/15331* (2013.01); *H01L 2924/3511* (2013.01)

(56) References Cited

U.S. PATENT DOCUMENTS

| | | | |
|---|---|---|---|
| 7,795,743 | B2 | 9/2010 | Kim et al. |
| 7,894,200 | B2 * | 2/2011 | Yoshino et al. ............... 361/761 |
| 8,653,640 | B2 * | 2/2014 | Kim et al. ..................... 257/686 |
| 2008/0283994 | A1 | 11/2008 | Tsai et al. |
| 2010/0072600 | A1 | 3/2010 | Gerber |
| 2011/0316119 | A1 | 12/2011 | Kim et al. |
| 2012/0083073 | A1 * | 4/2012 | Tanuma et al. ............... 438/125 |

FOREIGN PATENT DOCUMENTS

| | | |
|---|---|---|
| JP | 2004140222 A | 5/2004 |
| JP | 2009054741 A | 3/2009 |
| JP | 2010098129 A | 4/2010 |

* cited by examiner

SEMICONDUCTOR PACKAGING APPARATUS FORMED FROM SEMICONDUCTOR PACKAGE INCLUDING FIRST AND SECOND SOLDER BALLS HAVING DIFFERENT HEIGHTS

CROSS-REFERENCE TO RELATED APPLICATIONS

This application claims priority under 35 U.S.C. §119 to Korean Patent Application No. 10-2012-0109258, filed on Sep. 28, 2012, in the Korean Intellectual Property Office, the disclosure of which is incorporated herein in its entirety by reference.

BACKGROUND

Example embodiments of inventive concepts relate to a semiconductor package apparatus.

Generally, a semiconductor package apparatus may be completed through processes of die-bonding one or more semiconductor chips on the surface of a lead frame or a printed circuit board, wire-bonding and flip-chip-bonding the lead of the lead frame or the terminals of the printed circuit board to be electrically connected to the semiconductor chips, and then sealing the semiconductor chips by covering the semiconductor chips with an insulating sealant.

Furthermore, some examples of technologies for reducing the size of such a semiconductor package apparatus are a package on package (POP) technology in which a package is stacked on a package, a system on chip (SOC) technology in which various functions are included in one chip, and a system in package technology in which semiconductor chips (e.g., a memory chip and a control chip) in charge of a plurality of functions are integrated into one package.

SUMMARY

Example embodiments of inventive concepts relate to a semiconductor package apparatus that includes partially differently forming the height of some solder balls by controlling the diameter of an opening of a solder resist.

According to example embodiments of inventive concepts, a semiconductor package apparatus includes: a first semiconductor package including a first substrate, a first solder resist layer on the first substrate, and a first sealing member that covers and protects the first solder resist layer; and a plurality of solder balls on the first substrate. The plurality of solder balls include a first solder ball having a first height and a second solder ball having a second height that is different from the first height. The first sealing member defines holes that expose the solder balls. The first solder resist layer may include a first opening having a first diameter and a second opening having a second diameter that is different from the first diameter.

In example embodiments, the first solder resist layer may further include a third opening having a third diameter that is different from the first diameter and the second diameter, and the plurality of solder balls may further include a third solder ball having a third height that is different from the first height and the second height, the third solder ball being in the third opening.

In example embodiments, the semiconductor package apparatus may further include a second semiconductor package on the first semiconductor package. The holes may be laser-drilled holes.

In example embodiments, the first opening may have a first diameter and the second opening may have a second diameter that is larger than the first diameter. The first solder ball may have a first height and the second solder ball may have a second height that is smaller than the first height. The first solder ball may be in the first opening close to an edge part of the first substrate, and the second solder ball may be in the second opening close to a central portion of the first substrate.

In example embodiments, the first opening may have a first diameter and the second opening may have a second diameter that is larger than the first diameter. The first solder ball may have a first height and the second solder ball may have a second height that is smaller than the first height. The first solder ball may be in the first opening close to a center portion of the first substrate, and the second solder ball may be in the second opening close to an edge part of the first substrate.

In example embodiments, the second semiconductor package may include: a second substrate, a second solder resist layer on the second substrate and a plurality of other solder balls on the second substrate. The second solder resist layer may define a plurality of openings having equal diameters. The plurality of other solder balls may have equal diameters and may be located on the second substrate to correspond to the plurality of solder balls on the first substrate.

In example embodiments, the semiconductor package apparatus may further include a semiconductor chip on the first substrate, and the plurality of solder balls on the first substrate may be arranged in a rectangular ring shape to surround all sides of the first semiconductor chip. The first solder ball may be at a corner edge portion of the rectangular ring shape, and the second solder ball may be at a central straight portion of the rectangular ring shape.

In example embodiments, the first solder resist layer may include a first angled opening having a first inclined angle and a second angled opening having a second inclined angle. The second inclined angle may be different from the first inclined angle.

In example embodiments, the first solder resist layer may include a first layer having a first thickness and a second layer having a second thickness, the second thickness may be different than the first thickness, the first layer may define a first opening, and the second layer may define a second opening.

According to example embodiments of inventive concepts a semiconductor package apparatus includes: a first semiconductor package; a second semiconductor package on the first semiconductor package; a first solder resist layer on the first semiconductor package, the first solder resist layer defining a first opening having a first diameter and a second opening having a second diameter that is different than the first diameter; a first sealing member on the first solder resist layer, the first sealing member defining a first hole and a second hole corresponding to the first opening and the second opening of the first solder resist layer; and signal transmission members between the first semiconductor package and the second semiconductor package so that the first semiconductor package is electrically connected to the second semiconductor package. The signal transmission members may include a first signal transmission member having a first height that extends through the first opening and the first hole and a second signal transmission member having a second height that extends through the second opening and the second hole, the second height being different from the first height.

In example embodiments, the first signal transmission member may be one of a plurality of first signal transmission members having the first height, and the second signal transmission member may be one of a plurality of second signal transmission members having the second height, and at least two of the plurality of second signal transmission members may be between at least two of the plurality of first signal transmission members. The first signal transmission member and the second signal transmission member each may be solder columns formed by bonding a solder ball on an upper portion of a first substrate of the first semiconductor package with another solder ball on a lower portion of a second substrate of the second semiconductor package.

In example embodiments, the first signal transmission member may include a first bump and a first solder unit on the first bump, and the second signal transmission member may include a second bump and a second solder unit on the second bump, and a height of the second bump may be different than a height of the first bump.

In example embodiments, the first bump and the second bump may be on a pad of a first substrate of the first semiconductor package.

According to example embodiments of inventive concepts, a semiconductor package apparatus includes: a first substrate; a first resist layer on the first substrate; a first sealing layer on the first resist layer; at least one first solder-containing member; and at least one second solder-containing member. The first resist layer and the first sealing layer define at least one first opening having a first diameter and at least one second opening having a second diameter, the first diameter and the second diameter being different from each other. The at least one first solder-containing member extends a first height from the substrate at least partially through a corresponding one of the at least one first opening. The at least one second solder-containing member extends a second height from the substrate at least partially through a corresponding one of the at least one second opening. The first height and the second height are different from each other.

In example embodiments, each one of the at least one first solder-containing member includes a same one of a first solder ball and a first signal transmission member, and each one of the at least one second solder-containing member includes a same one of a second solder ball and a second signal transmission member.

In example embodiments, each one of the at least one first solder-containing member includes the first solder ball, each one of the at least one second solder-containing member includes the second solder ball, and a volume of the first solder ball is equal to a volume of the second solder ball.

In example embodiments, the semiconductor package may further include a second substrate, wherein the second substrate may include other solder balls spaced apart from each other and connected to a lower surface of the second substrate, and the other solder balls may be on corresponding ones of the at least one first solder-containing member and the at least one second solder-containing member.

In example embodiments, the semiconductor package may further include a semiconductor chip on a center portion of the first substrate, wherein the at least one first solder-containing member may include a plurality of first solder-containing members, the at least one second solder-containing member may include a plurality of second solder-containing members, the plurality of first solder-containing members and the plurality of second solder-containing members (in combination) may be arranged in a rectangular ring shape that surrounds the semiconductor chip, the plurality of first solder-containing members may be arranged at one of a corner edge portion and a central straight portion of the rectangular shape, and the plurality of second solder-containing members may be arranged at another of the corner edge portion and the central straight portion of the rectangular shape.

BRIEF DESCRIPTION OF THE DRAWINGS

Example embodiments of inventive concepts will be more clearly understood from the following detailed description of non-limiting embodiments of inventive concepts, as illustrated in the accompanying drawings, in which.

DETAILED DESCRIPTION OF THE EMBODIMENTS

Figure 1:
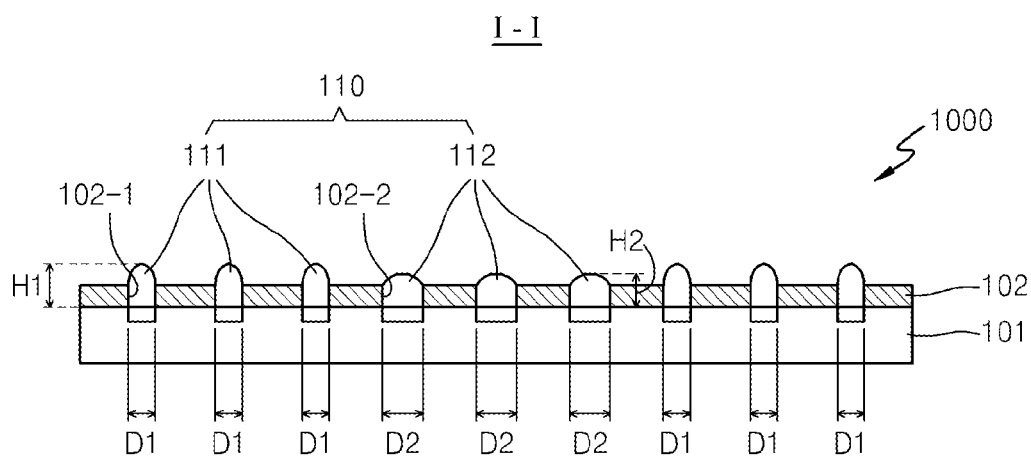
FIG. 1 is a cross-sectional view illustrating a semiconductor package apparatus according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

As used herein, the term "and/or" includes any and all combinations of one or more of the associated listed items.

In the case where a position relationship between two items are described with the terms "on ~," "connected to ~," "stacked on ~", "coupled with ~" or the like, one or more items may directly contact each other or there may be another element interposed therebetween. In contrast, in the case where a position relationship between two items are described with the terms "directly on ~," "directly connected to ~," "directly stacked on ~", "directly coupled with ~" or the like, it is understood that there is no element interposed therebetween. Other words used to describe the relationship between elements or layers should be interpreted in a like fashion Terms such as "first" and "second" are used to describe various members, parts, areas, layers and/or portions in the present specification, but it is obvious that the members, parts, areas, layers and/or portions are should not be limited by such terms. Such terms are used only to distinguish one member, part, area, layer or portion from another member, part, area, layer or portion. Hence, a first member, part, area, layer or portion to be described later may also refer to a second member, part, area, layer or portion within the scope of example embodiments of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor package apparatus 1000 according to example embodiments of inventive concepts.

First, as illustrated in FIG. 1, the semiconductor package apparatus 1000 according to example embodiments of inventive concepts may include a first substrate 101, a plurality of solder balls 110, and a solder resist layer 102. Here, FIG. 1 may be a cross-sectional view conceptually showing the first substrate 101, the view taken along line I-I of FIG. 6 to be described later.

Furthermore, the first substrate 101 may basically include insulating layers of various groups such as epoxy resin, bakelite resin, paper epoxy, glass epoxy, etc. Further, a circuit layer made of gold (Au), silver (Ag), platinum (Pt), aluminum (Al), copper (Cu), etc. may be formed on a surface of the first substrate 101. Further, the first substrate 101 may be a printed circuit board (PCB) on which a semiconductor chip may be stacked. Further, the first substrate 101 may be a multi-layer printed circuit board on which a plurality of insulating layers and a plurality of circuit layers are stacked as a multi-layer structure. However, the first substrate 101 is not limited to a material or method.

Furthermore, the solder balls 110 are installed on the first substrate 101. The solder balls 110 may include first solder balls 111 and second solder balls 112.

Here, the first solder ball 111 has a first height H1 from the first substrate 101, and the second solder ball 112 has a second height H2 that is different from the first height H1.

The solder balls 110 may be formed of lead (Pb), tin (Sn), an alloy of lead (Pb) and tin (Sn), silver (Ag), copper (Cu), aluminum (Al), etc., and may be formed by a soldering device. Further, the material of the solder balls 110 is not limited to solder that is an alloy of lead (Pb) and tin (Sn), and the shape of the solder balls 110 is not limited to a ball shape. For example, the material of the first solder ball 111 and the second solder ball 112 may be lead (Pb), tin (Sn), silver (Ag), copper (Cu), aluminum (Al), etc. as well as solder, and the shapes of the first solder ball 111 and the second solder ball 112 may be a cylinder, a polygonal prism, a polyhedron, a poly curved surface, a complex curved surface, etc. as well as a ball. However, the first solder ball 111 and the second solder ball 112 are not limited to the above materials or shapes.

Furthermore, as illustrated in FIG. 1, the solder resist layer 102 is provided on the first substrate 101, and a first opening 102-1 having a first diameter D1 and a second opening 102-2 having a second diameter D2 that is different from the first diameter D1 may be formed. Here, the first opening 102-1 and the second opening 102-2 may be formed in a circular shape, and may also be formed as other shapes such as an oval, a triangle, a quadrangle, a polygon, etc.

That is, in a soldering device for forming the solder balls 110, if the volumes of the solder balls 110 supplied to the first substrate 101 are constant, the first solder ball 111 may be formed at the first opening 102-1 having a relatively small first diameter D1 so that the solder rises up to have a relatively large first height H1, and the second solder ball 112 may be formed at the second opening 102-2 having a relatively large second diameter D2 so that the solder spreads sideways and has a relatively small second height H2.

Furthermore, the solder resist layer 102 may be a layer for covering and protecting a circuit layer made of gold (Au), silver (Ag), platinum (Pt), aluminum (Al), copper (Cu), etc., or the surface of the first substrate 101. For example, the solder resist layer 102 may include a resin compound having an unsaturated double bond with an unsaturated carboxylic acid such as an acrylic acid or having an unsaturated double bond with an epoxy group, a photosensitive photopolymer, a colorant, a hardening coating material, etc. Further, the solder resist layer 102 may be formed by drying, by developing by using acid or an alkali water solution, or by etching by using ultraviolet rays, infrared rays, visible rays, or laser beams to form a pattern on the surface of the first substrate 101. Further, the colorant colors resin, and helps stabilization by limiting (and/or preventing) a hardening phenomenon by limiting (and/or blocking) light absorption and allows selective etching by radiating laser beams on a desired region by allowing a reaction to only light of a certain wavelength. Further, the solder resist layer 102 may be made of materials of various synthetic resins including epoxy resin, a hardening agent, an organic/inorganic filler, etc. as well as a resin compound having an unsaturated double bond with an unsaturated carboxylic acid such as an acrylic acid or having an unsaturated double bond with an epoxy group, a photosensitive photopolymer, a colorant, and a hardening coating material, and may be molded inside a mold. The moldable solder resist layer 102 may be formed of a polymer such as resin, and may include the existing sealing member or an underfill member (for example, formed of an epoxy molding compound (EMC)). However, the materials and methods of the solder resist layer 102 are not limited to the above materials and methods.

Figure 2:
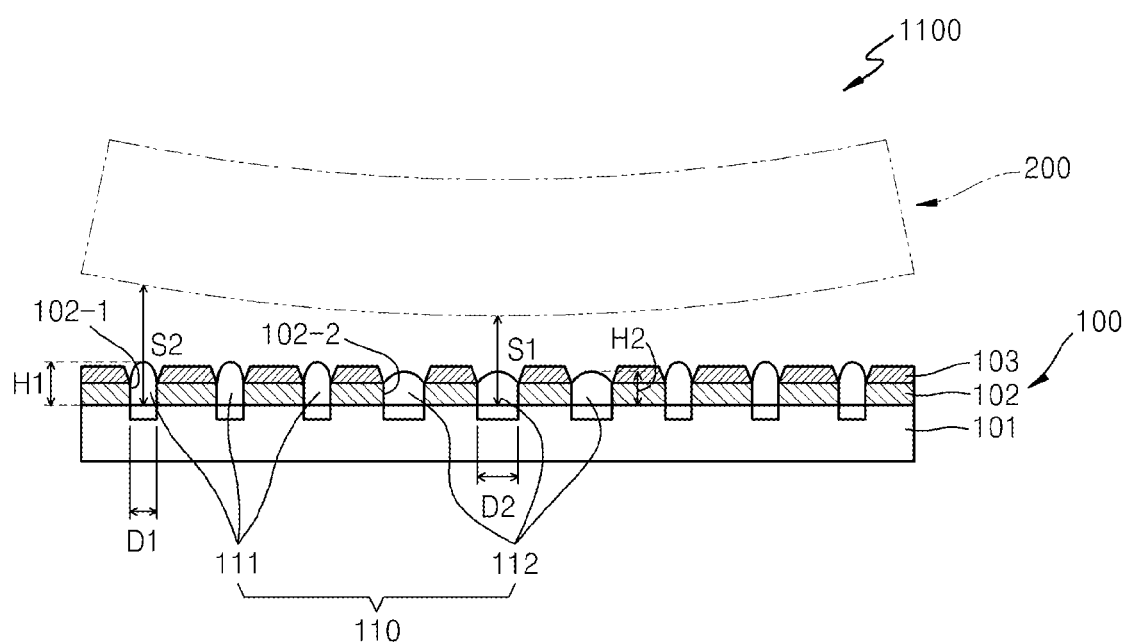
FIG. 2 is a cross-sectional view illustrating a semiconductor package apparatus according to example embodiments of inventive concepts.
Figure 3:
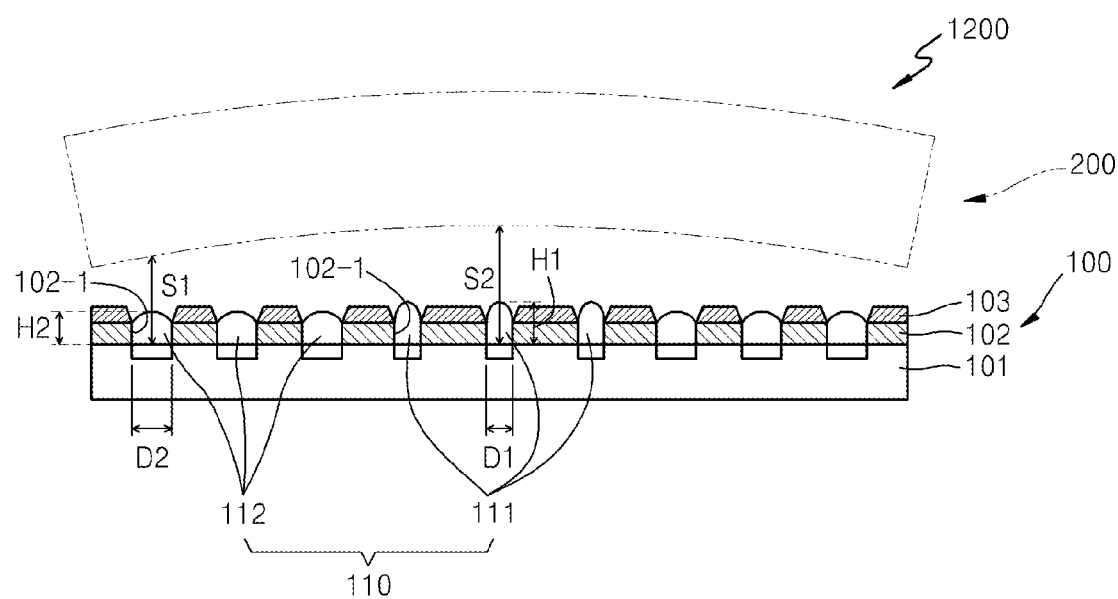
FIG. 3 is a cross-sectional view illustrating a semiconductor package apparatus according to example embodiments of inventive concepts.
Figure 4:
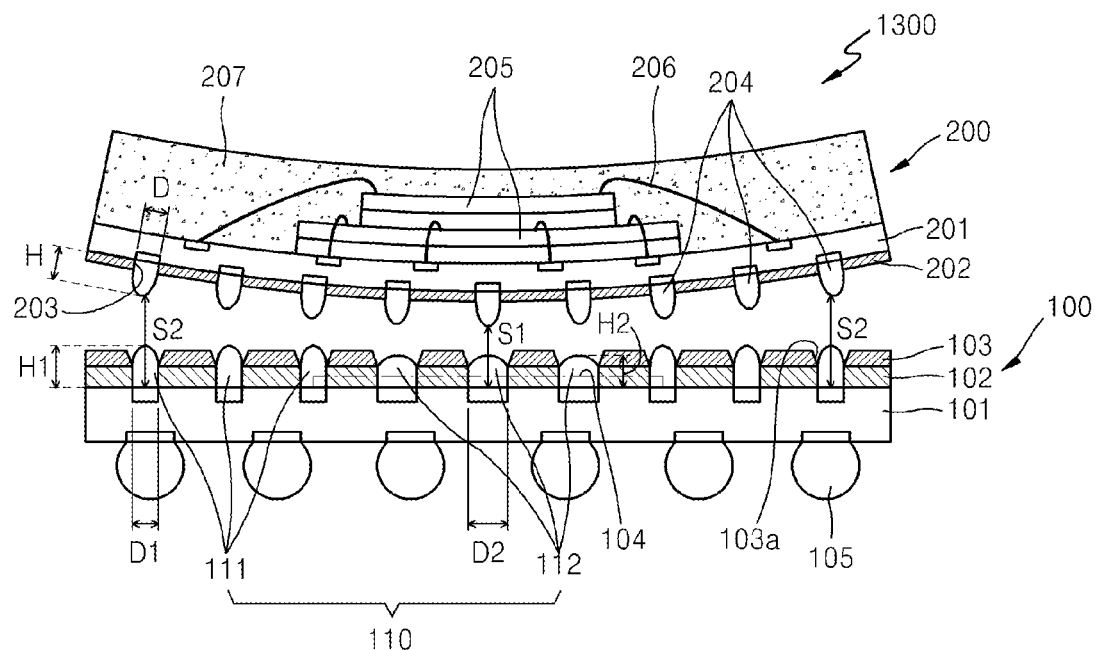
FIG. 4 is a cross-sectional view illustrating a semiconductor package apparatus according to example embodiments.
Figure 5:
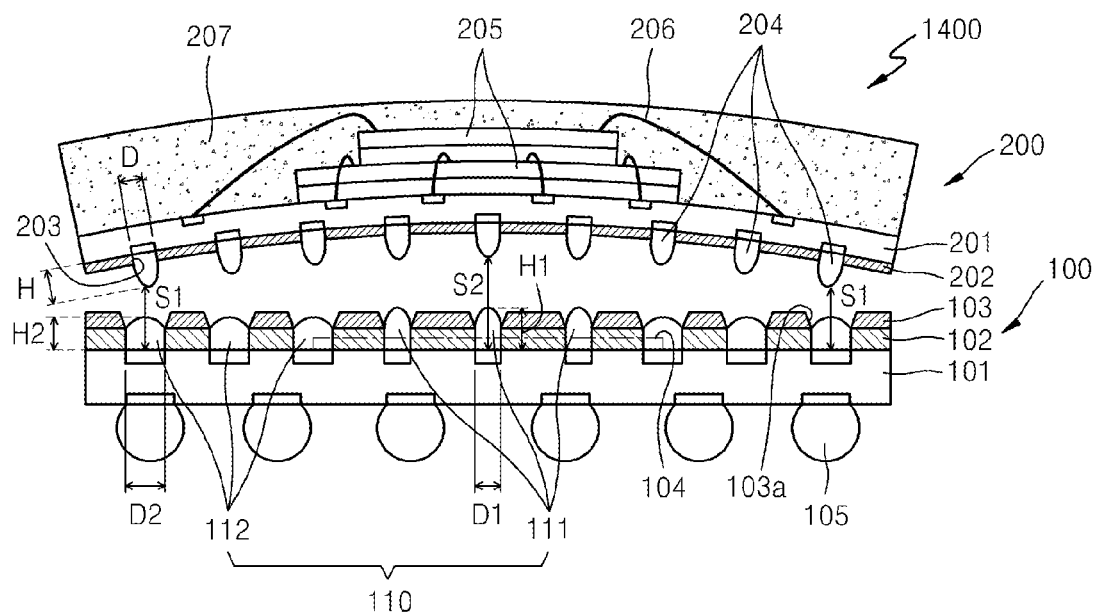
FIG. 5 is a cross-sectional view illustrating a semiconductor package apparatus according to example embodiments.

FIG. 2 is a cross-sectional view illustrating a semiconductor package apparatus 1100 according to example embodiments of inventive concepts, FIG. 3 is a cross-sectional view illustrating a semiconductor package apparatus 1200 according to example embodiments of inventive concepts, FIG. 4 is a cross-sectional view illustrating a semiconductor package apparatus 1300 according to example embodiments of inventive concepts, and FIG. 5 is a cross-sectional view illustrating a semiconductor package apparatus 1400 according to example embodiments of inventive concepts.

Here, as illustrated in FIGS. 2 to 5, the semiconductor package apparatuses 1100, 1200, 1300, and 1400 according to example embodiments of inventive concepts may further include a first semiconductor package 100 including the first substrate 101 and a second semiconductor package 200 stacked on the first semiconductor package 100.

As illustrated in FIGS. 2 and 4, when it is expected that the first substrate 101 or the second semiconductor package 200 may be transformed such that the distance 51 between the central part of the first substrate 101 and the second semiconductor package 200 decreases, and the distance S2 between the edge part of the first substrate 101 and the second semiconductor package 200 increases, the first solder ball 111, which is formed at the first opening 102-1 having a relatively small first diameter D1 and thus has a relatively large first height H1, may be installed close to the edge part of the first substrate 101, and the second solder ball 112, which is formed at the second opening 102-2 having a relatively large second diameter D2 and thus has a relatively small second height H2, may be formed close to the central part of the first substrate 101.

Hence, in the semiconductor package apparatuses 1100 and 1300 according to example embodiments of inventive concepts, the first solder ball 111 having a relatively large first height H1 is placed at the edge part of the first substrate 101 so that the non-wet phenomenon that occurs in the edge part of the first substrate 101 may be reduced (and/or prevented), and since the volume of a solder ball is not changed, the short defect phenomenon, which has occurred due to the contact of neighboring solder balls in the edge part of the first substrate 101, may be fundamentally reduced (and/or prevented) unlike the conventional art where the solder ball volume is excessively increased to reduce (and/or prevent) the non-wet phenomenon.

Furthermore, as illustrated in FIGS. 3 and 5, when it is expected that the first substrate 101 or the second semiconductor package 200 may be transformed such that the distance S2 between the central part of the first substrate 101 and the second semiconductor package 200 increases, and the distance S1 between the edge part of the first substrate 101 and the second semiconductor package 200 decreases, the first solder ball 111, which is formed at the first opening 102-1 having a relatively small first diameter D1 and thus has a relatively large first height H1, may be installed close to the central part of the first substrate 101, and the second solder ball 112, which is formed at the second opening 102-2 having a relatively large second diameter D2 and thus has a relatively small second height H2, may be formed close to the edge part of the first substrate 101.

Hence, in the semiconductor package apparatuses 1200 and 1400 according to example embodiments of inventive concepts, the first solder ball 111 having a relatively large first height H1 is placed at the central part of the first substrate 101 so that the non-wet phenomenon that occurs in the central part of the first substrate 101 may be reduced (and/or prevented), and since the volume of a solder ball is not changed, the short defect phenomenon, which has occurred due to the contact of neighboring solder balls in the edge part of the first substrate 101, may be fundamentally reduced (and/or prevented) unlike the conventional art where the solder ball volume is excessively increased to reduce (and/or prevent) the non-wet phenomenon.

Furthermore, as illustrated in FIGS. 4 and 5, the semiconductor package apparatuses 1300 and 1400 according to example embodiments of inventive concepts may be a package on package (POP) type in which a second semiconductor package 200 is stacked on a first semiconductor package 100.

That is, the first semiconductor package 100 may include the first substrate 101, a first semiconductor chip 104 installed at one surface of the first substrate 101, a first sealing member 103 for protecting the solder resist layer 102 on the first substrate 101 and the first semiconductor chip 104, and an external connection solder 105 installed at the other surface of the first substrate 101.

Here, as illustrated in FIGS. 4 and 5, the first sealing member 103 covers and protects the first semiconductor chip 104 and the solder resist layer 102, and has laser-drilled holes to expose the solder balls 110. Further, the first sealing member 103 may be made of various synthetic resins including epoxy resin, a hardening agent, an organic/inorganic filler, etc., and may be molded inside a mold. The first sealing member 103 may be formed of a polymer such as resin. For example, the first sealing member 103 may be formed as an EMC. However, the first sealing member 103 is not limited to the above materials and methods. As shown in FIGS. 4-5, the first sealing member 103 may include tapered sidewalls 103a that expose the solder first solder balls 111 and second solder balls 112.

Furthermore, the external connection solder 105 electrically connects the first semiconductor package 100 and the second semiconductor package 200 to external devices, and may be formed of lead (Pb), tin (Sn), an alloy of lead (Pb) and tin (Sn), silver (Ag), copper (Cu), aluminum (Al), etc., and may be formed by a soldering device.

Further, the external connection solder 105 is not limited to solder that is an alloy of lead (Pb) and tin (Sn), and the material of the external connection solder 105 may be lead (Pb), tin (Sn), silver (Ag), copper (Cu), aluminum (Al), etc. as well as solder, and the shape may be a solder ball, a cylinder, a polygonal prism, a polyhedron, a poly curved surface, a complex curved surface, etc. However, the external connection solder 105 is not limited to the above materials or methods.

The second semiconductor package 200 may include a second substrate 201, a second semiconductor chip 205 installed on the second substrate 201, a solder resist layer 202 which is installed on the second substrate 201 and in which openings 203 having the same diameters D are formed, solder balls 204 which are installed on the second substrate 201 to correspond to the solder balls 110 of the first substrate 101 at a reflow process and are formed at the openings 203 to have the same heights H, a wire 206 that electrically connects the second substrate 201 with the second semiconductor chip 205, and a second sealing member 207 that covers and protects the second semiconductor chip 205.

Here, the openings 203 do not necessarily have the same diameters D, and may have different diameters as the first openings 102-1 and the second openings 102-2 of the first substrate 201. The solder balls 204 may also have different heights as the solder balls 110 of the first substrate 201.

Furthermore, the second substrate 201 basically includes insulating layers of various resin groups such as epoxy resin, bakelite resin, paper epoxy, and glass epoxy, and a circuit layer made of gold (Au), silver (Ag), platinum (Pt), aluminum (Al), copper (Cu), etc. may be formed on a surface of the second substrate 201. Further, the second substrate 201 may be a printed circuit board (PCB) on which a semiconductor chip may be stacked. Further, the second substrate 201 may be a multi-layer printed circuit board on which a plurality of insulating layers and a plurality of circuit layers are stacked as a multi-layer structure. However, the second substrate 201 is not limited to the materials or methods.

Furthermore, the solder resist layer 202 of the second substrate 201 covers and protects the surface of the second substrate 201 or a circuit layer made of gold (Au), silver (Ag), platinum (Pt), aluminum (Al), copper (Cu), etc. Further, the solder resist layer 202 may be formed of, for example, a resin compound having an unsaturated double bond with an unsaturated carboxylic acid such as an acrylic acid or having an unsaturated double bond with an epoxy group, a photosensitive photopolymer, a colorant, a hardening coating material, etc. Further, the solder resist layer 202 may be formed by drying, developing by using acid or an alkali water solution, etching by using ultraviolet rays, infrared rays, visible rays, or laser beams to form a pattern on the surface of the second substrate 201. Further, the colorant colors resin, and helps stabilization by reducing (and/or preventing) a hardening phenomenon by blocking light absorption and allows selective etching by radiating laser beams on a desired region by allowing a reaction to only light of a certain wavelength. Further, the solder resist layer 202 of example embodiments of inventive concepts may be made of materials of various synthetic resins including epoxy resin, a hardening agent, an organic/inorganic filler, etc. as well as a resin compound having an unsaturated double bond with an unsaturated carboxylic acid such as an acrylic acid or having an unsaturated double bond with an epoxy group, a photosensitive photopolymer, a colorant, and a hardening coating material, and may be molded inside a mold. The moldable solder resist layer 202 may be formed of a polymer such as resin, and may include the existing sealing member or an underfill member (for example, formed of an EMC). However, the materials and methods of the solder resist layer 102 are not limited to the above materials and methods.

Furthermore, the solder balls 204 may be formed of lead (Pb), tin (Sn), an alloy of lead (Pb) and tin (Sn), silver (Ag), copper (Cu), aluminum (Al), etc, and may be formed by a soldering device, but the material is not limited to solder that is an alloy of lead (Pb) and tin (Sn), and the shape is not necessarily a ball shape. For example, the material of the solder balls 204 may be lead (Pb), tin (Sn), silver (Ag), copper (Cu), aluminum (Al), etc. as well as solder, and the shape may be a solder ball, a cylinder, a polygonal prism, a polyhedron, a poly curved surface, a complex curved surface, etc. However, the solder balls 204 are not limited to the above materials or methods. For example, the solder balls 204 may be substituted by various bumps. The bumps may be formed of gold (Au), silver (Ag), platinum (Pt), aluminum (Al), copper (Cu), solder, etc., and may be formed through a pulse plating method or a direct current (DC) plating method.

Furthermore, the wire 206 is a wire for bonding a semiconductor, and may be formed of gold (Au), silver (Ag), platinum (Pt), aluminum (Al), copper (Cu), palladium (Pd), nickel (Ni), cobalt (Co), chrome (Cr), titanium (Ti), etc. and may be formed by a wire bonding device. However, the wire 206 is not limited to the above materials or method.

Furthermore, the second sealing member 207 covers and protects the second semiconductor chip 205 and the wire 206, and may be made of materials of various synthetic resins including epoxy resin, a hardening agent, an organic/inorganic filler, etc. and be molded inside a mold. The second sealing member 207 may be formed as a polymer such as resin (for example, formed as an EMC). However, the materials and methods of the second sealing member 207 are not limited to the above materials and methods.

Figure 6:
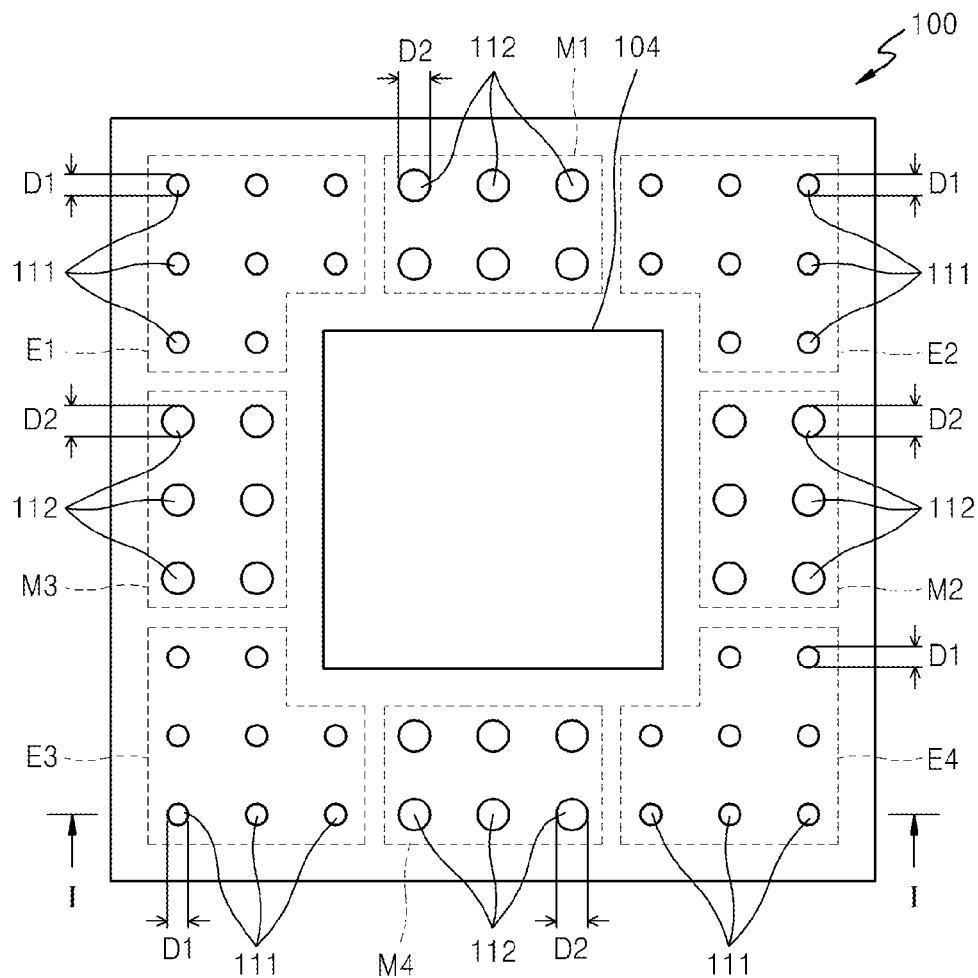
FIG. 6 is a view illustrating a first semiconductor package of the semiconductor package apparatus of FIG. 4.

FIG. 6 is a view illustrating the first semiconductor package 100 of the semiconductor package apparatus 1300 according to example embodiments of inventive concepts of FIG. 4.

As illustrated in FIG. 6, the solder balls 110 of the first substrate 101 may be placed at dashed line areas of a rectangular ring shape (areas indicated as dashed lines in FIG. 6; E1, M1, E2, M2, E3, M3, E4, and M4) to cover the first semiconductor chip 104 in all directions.

Here, as illustrated in FIGS. 2 and 4, when it is expected that the first substrate 101 or the second semiconductor package 200 is transformed such that the distance S1 between the central part of the first substrate 101 and the second semiconductor package 200 decreases, and the distance S2 between the edge part of the first substrate 101 and the second semiconductor package 200 increases, the first solder balls 111 may be placed at corner edge portions E1, E2, E3, and E4 of the rectangular ring shape, and the second solder balls 112 may be placed at the central portions M1, M2, M3, and M4 of the rectangular ring shape.

Furthermore, as shown in FIGS. 3 and 5, when it is expected that the first substrate 101 or the second semiconductor package 200 is transformed such that the distance S2 between the central part of the first substrate 101 and the second semiconductor package 200 increases, and the distance S1 between the edge part of the first substrate 101 and the second semiconductor package 200 decreases, the second solder balls 112 may be placed at corner edge portions E1, E2, E3, and E4 of the rectangular ring shape, and the first solder balls 111 may be placed at the central portions M1, M2, M3, and M4 of the rectangular ring shape.

Figure 7:
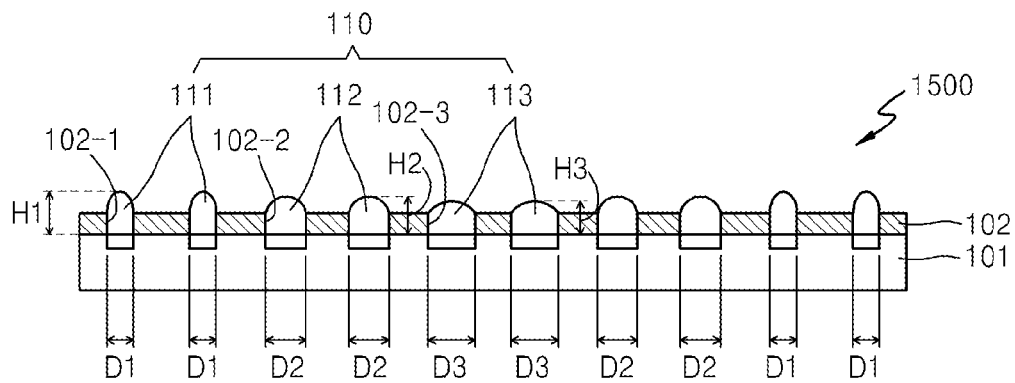
FIG. 7 is a cross-sectional view illustrating a semiconductor package apparatus according to example embodiments of inventive concepts.
Figure 8:
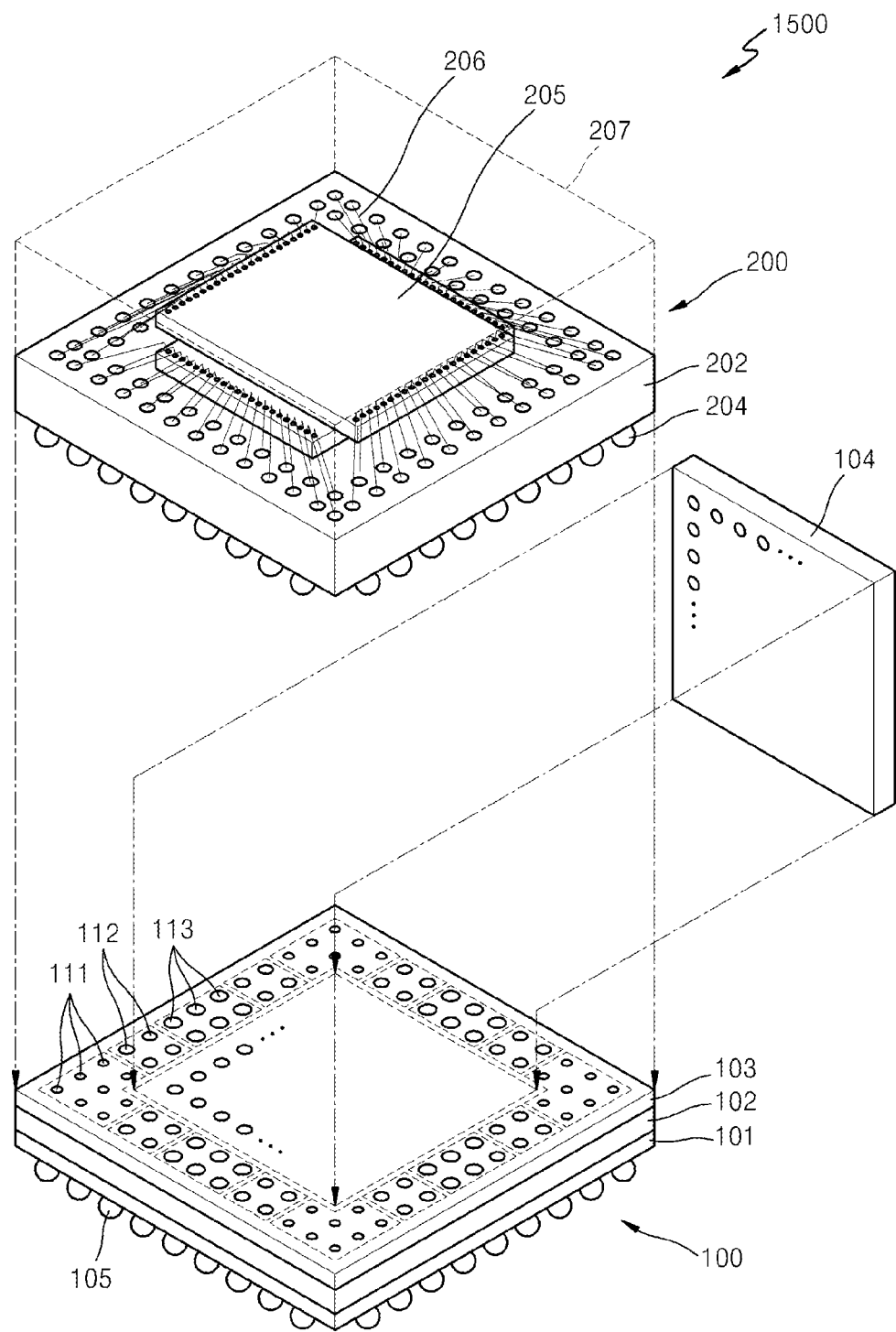
FIG. 8 is an exploded oblique view illustrating a state in which a second semiconductor package is stacked on a first semiconductor package of FIG. 7.

FIG. 7 is a cross-sectional view illustrating a semiconductor package apparatus 1500 according to example embodiments of inventive concepts, and FIG. 8 is an exploded perspective view illustrating a state in which a second semiconductor package 200 is stacked on a first semiconductor package 100 of FIG. 7.

As illustrated in FIGS. 7 and 8, the solder resist layer 102 of the first substrate 101 may include a third opening 102-3 having a third diameter D3 that is different from the first diameter D1 and the second diameter D2, and the semiconductor package apparatus 1500 according to example embodiments of inventive concepts may further include a third solder ball 113 which is installed at the third opening 102-3 and has a third height H3 that is different from the first height H1 and the second height H2.

For example, as illustrated in FIG. 7, the first solder ball 111, which is formed at the first opening 102-1 having relatively the smallest diameter D1 and thus has relatively the largest height H1, may be installed close to the edge part of the first substrate 101, the third solder ball 113, which is formed at the third opening 102-3 having relatively the largest diameter D3 and thus has relatively the smallest height H3, may be formed close to the central part of the first substrate 101, and the second solder ball 112, which is formed at the second opening 102-2 having relatively the medium diameter D2 and thus has relatively the medium height H2, may be installed between the first solder ball 111 and the third solder ball 113.

Figure 9:
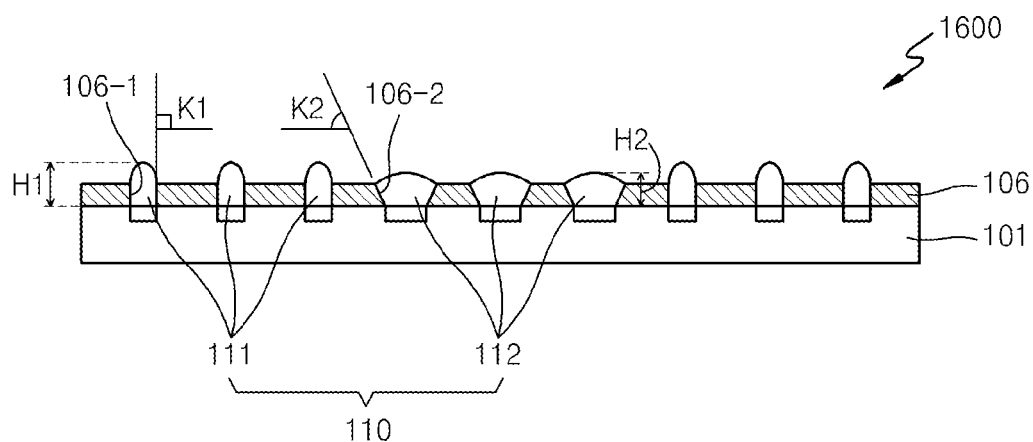
FIG. 9 is a cross-sectional view illustrating a semiconductor package apparatus according to example embodiments of inventive concepts.

FIG. 9 is a cross-sectional view illustrating a semiconductor package apparatus 1600 according to example embodiments of inventive concepts.

As illustrated in FIG. 9, the semiconductor package apparatus 1600 according to example embodiments of inventive concepts may be installed on the first substrate 101, and may further include a solder resist layer 106 on the first substrate 101, where a first angled opening 106-1 having a first inclined angle K1 and a second angled opening 106-2 having a second inclined angle K2 that is different from the first angle K1 are formed.

For example, as illustrated in FIG. 9, if the first inclined angle K1 of the first opening 106-1 is larger than the second inclined angle K2 of the second angled opening 106-2, the first height H1 of the first solder ball 111 formed at the first opening 106-1 may be higher than the height H2 of the second solder ball 112 formed at the second angled opening 106-2 due to the surface tension (cohesion) phenomenon of a solder ball in a melted state. Although FIG. 9 illustrates the first inclined angle K1 is perpendicular with regard to the solder resister layer 106, example embodiments of inventive concepts are not limited thereto and the first inclined angle K1 may alternatively be less than 90 degrees when the first inclined angle K1 is greater than the second inclined angle K2.

Here, the first opening 106-1 and the second angled opening 106-2 are formed in the solder resist layer 106, and may be differentially etched where the first inclined angle K1 differs from the second inclined angle K2 by an acid or an alkali water solution depending on the material of the solder resist layer 106 or may be differentially etched by ultraviolet rays, infrared rays, visible rays, or laser beams.

Figure 22:
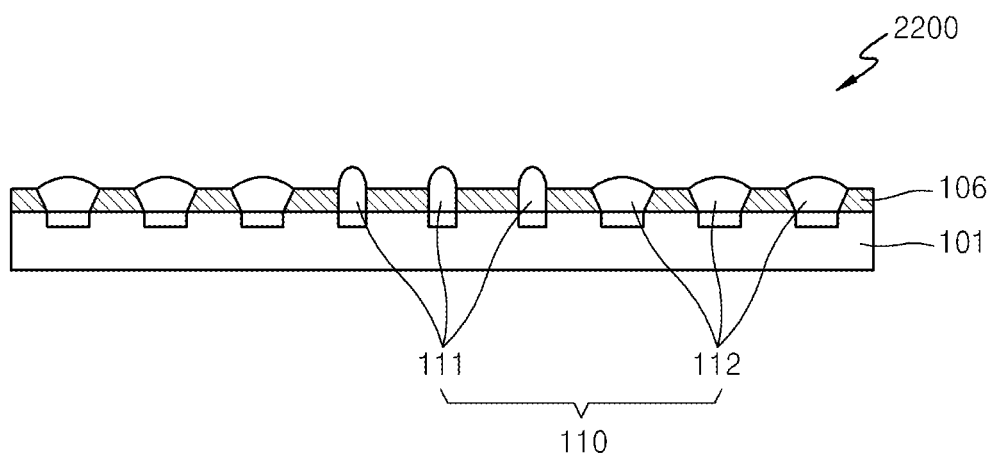
FIG. 22 is a cross-sectional view illustrating a semiconductor package apparatus according to example embodiments of inventive concepts.

Although FIG. 9 illustrates the second solder balls 112 on a central portion of the first substrate 101 between the first solder balls 111, example embodiments are not limited thereto. For example, FIG. 22 is a cross-sectional view illustrating a semiconductor package apparatus according to example embodiments of inventive concepts. As shown in FIG. 22, a semiconductor package apparatus 2200 according to example embodiments of inventive concepts may differ from the semiconductor package apparatus 1600 in FIG. 9 in terms of the relative positions and/or numbers of the first solder ball 111 and second solder ball 112. In FIG. 22, the first solder balls 111 may be on a central portion of the substrate 101 and the second solder balls 112 may be on an edge portion of the substrate 101.

Figure 10:
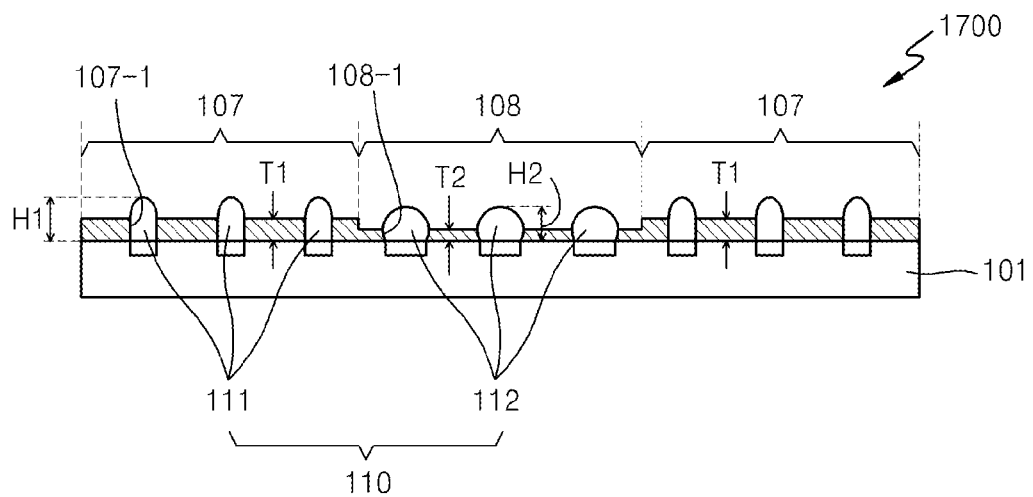
FIG. 10 is a cross-sectional view illustrating a semiconductor package apparatus according to example embodiments of inventive concepts.

FIG. 10 is a cross-sectional view illustrating a semiconductor package apparatus 1700 according to example embodiments of inventive concepts.

As illustrated in FIG. 10, the semiconductor package apparatus 1700 according to example embodiments of inventive concepts may include first and second solder resist layers 107 and 108 of the first substrate 101, wherein the first solder resist layer 107 has a first thickness T1, is installed on the first substrate 101 and a first opening 107-1 is formed therein, and a second solder resist layer 108 has a second thickness T2 that is different from the first thickness T1 and a second opening 108-1 is formed therein.

For example, as illustrated in FIG. 10, the first height H1 of the first solder ball 111 formed at the first opening 107-1 of the first solder resist layer 107 having a relatively thick first thickness T1 may be higher than the second height H2 of the second solder ball 112 formed at the second opening 108-1 of the second solder resist layer 108 having a relatively thin second thickness T2.

Here, the first thickness T1 of the first solder resist layer 107 may be formed sufficiently thick between about 40 μm and about 100 μm that is thicker than the existing thickness between about 20 μm and about 70 μm. Likewise, the thick first solder resist layer 107 may be formed in various methods such as increasing the viscosity of the solder resist solution, adjusting the application pressure or spraying amount, or increasing the number of applications, etc. For example, if the second solder resist layer 108 has been formed by applying the solder resist solution to the first substrate 101 once, the first solder resist layer 107 may be formed by applying the solder resist solution twice on the first substrate 101.

Figure 11:
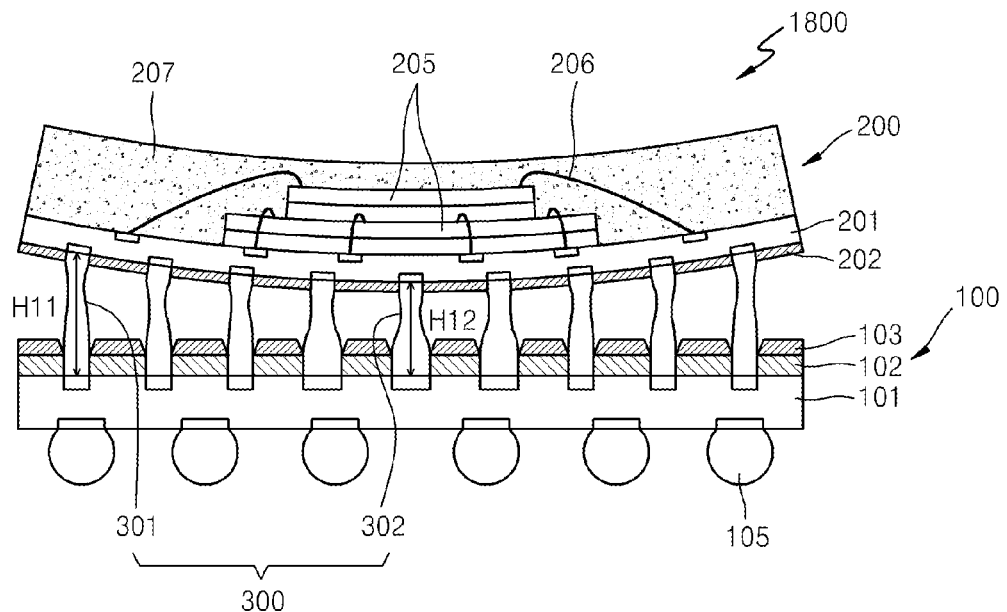
FIG. 11 is a cross-sectional view illustrating a semiconductor package apparatus according to example embodiments of inventive concepts.

FIG. 11 is a cross-sectional view illustrating a semiconductor package apparatus 1800 according to example embodiments of inventive concepts.

As illustrated in FIG. 11, the semiconductor package apparatus 1800 according to example embodiments of inventive concepts may include a first semiconductor package 100, a second semiconductor package 200, and signal transmission members 300.

Here, the second semiconductor package 200 may be stacked on the first semiconductor package 100 as illustrated in FIG. 4.

Furthermore, the signal transmission members 300 may include a first signal transmission member 301 having a first height H11 and a second signal transmission member 302 having a second height H12 that is different from the first height H11, which are installed at an area between the first semiconductor package 100 and the second semiconductor package 200 so that the first semiconductor package 100 is electrically connected to the second semiconductor package 200.

Figure 13:
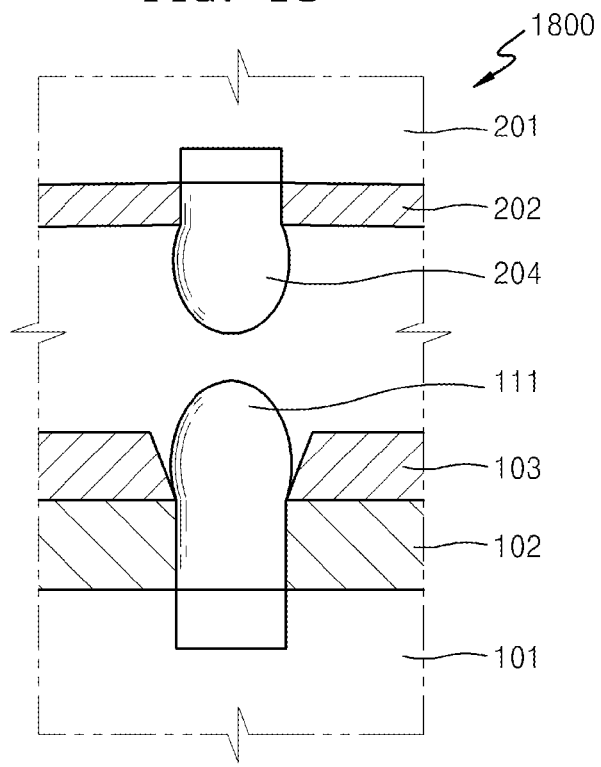
FIG. 13 is an enlarged cross-sectional view illustrating a state before a reflow process of FIG. 11.
Figure 14:
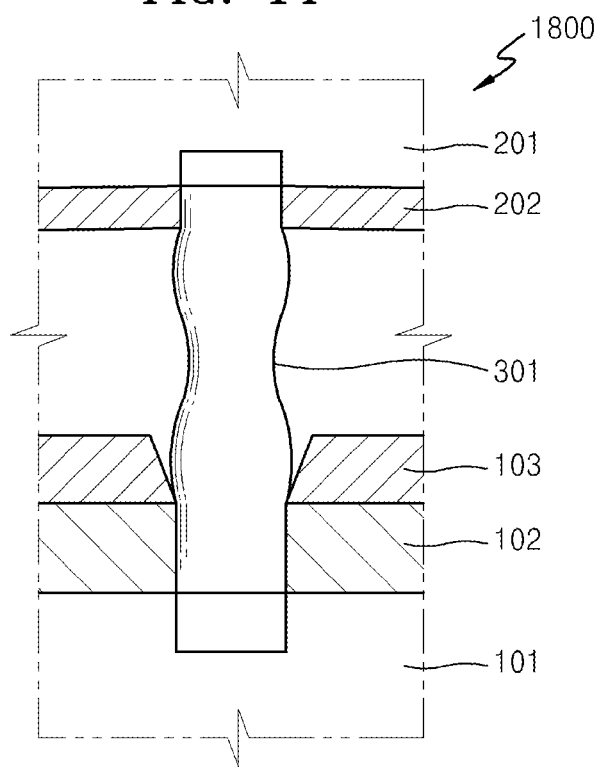
FIG. 14 is an enlarged cross-sectional view illustrating a state after the reflow process of FIG. 13.

Furthermore, FIG. 13 is an enlarged cross-sectional view illustrating a state before a reflow process of the semiconductor package apparatus 1800 of FIG. 11, and FIG. 14 is an enlarged cross-sectional view illustrating a state after the reflow process of FIG. 13.

That is, the first signal transmission member 301 of FIG. 11 in a solder column form of FIG. 14 may be formed by a reflow bonding of the first solder ball 111 of FIG. 13 formed on an upper part of the first substrate 101 of the first semiconductor package 100 with the solder ball 204 of FIG. 13 formed on a lower part of the second substrate 201 of the second semiconductor package 200. Here, the second signal transmission member 302 of FIG. 11 may also be formed by the reflow bonding process illustrated FIGS. 13 and 14.

The first signal transmission member 301 may be formed of lead (Pb), tin (Sn), an alloy of lead (Pb) and tin (Sn), silver (Ag), copper (Cu), aluminum (Al), etc., and may be formed by a reflow process. Further, the material of the first signal transmission member is not limited to solder that is an alloy of lead (Pb) and tin (Sn), and the shape of the first signal transmission member 301 is not limited to a column shape. For example, the material of the first signal transmission member 301 may be lead (Pb), tin (Sn), silver (Ag), copper (Cu), aluminum (Al), etc. as well as solder, and the shape may be a ball, a polygonal prism, a polyhedron, a poly curved surface, a complex curved surface, etc. as well as a column. However, the first signal transmission member 301 is not limited to the above materials or shapes.

Figure 12:
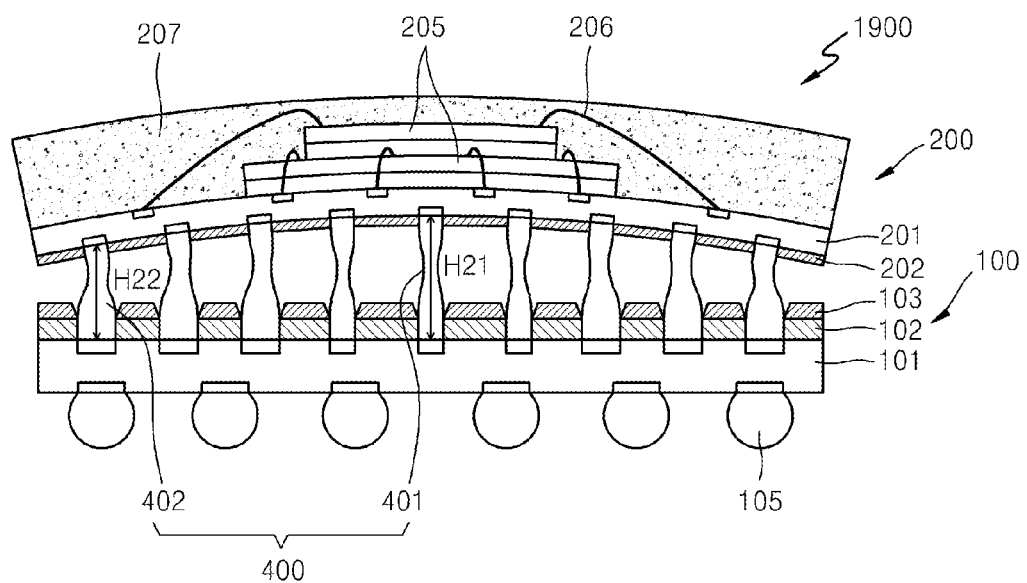
FIG. 12 is a cross-sectional view illustrating a semiconductor package apparatus according to example embodiments of inventive concepts.

FIG. 12 is a cross-sectional view illustrating a semiconductor package apparatus 1900 according to example embodiments of inventive concepts.

As illustrated in FIG. 12, the semiconductor package apparatus 1900 according to example embodiments of inventive concepts may include a first semiconductor package 100, a second semiconductor package 200, and signal transmission members 400.

Here, the second semiconductor package 200 may be stacked on the first semiconductor package 100 as illustrated in FIG. 5.

Furthermore, the signal transmission members 400 may include a first signal transmission member 401 having a first height H21 and a second signal transmission member 402 having a second height H22 that is different from the first height H21, which are installed in an area between the first semiconductor package 100 and the second semiconductor package 200 so that the first semiconductor package 100 is electrically connected to the second semiconductor package 200. Here, the first signal transmission member 401 and the second signal transmission member 402 of FIG. 12 may also be formed by the reflow bonding process illustrated in FIGS. 13 and 14.

Figure 15:
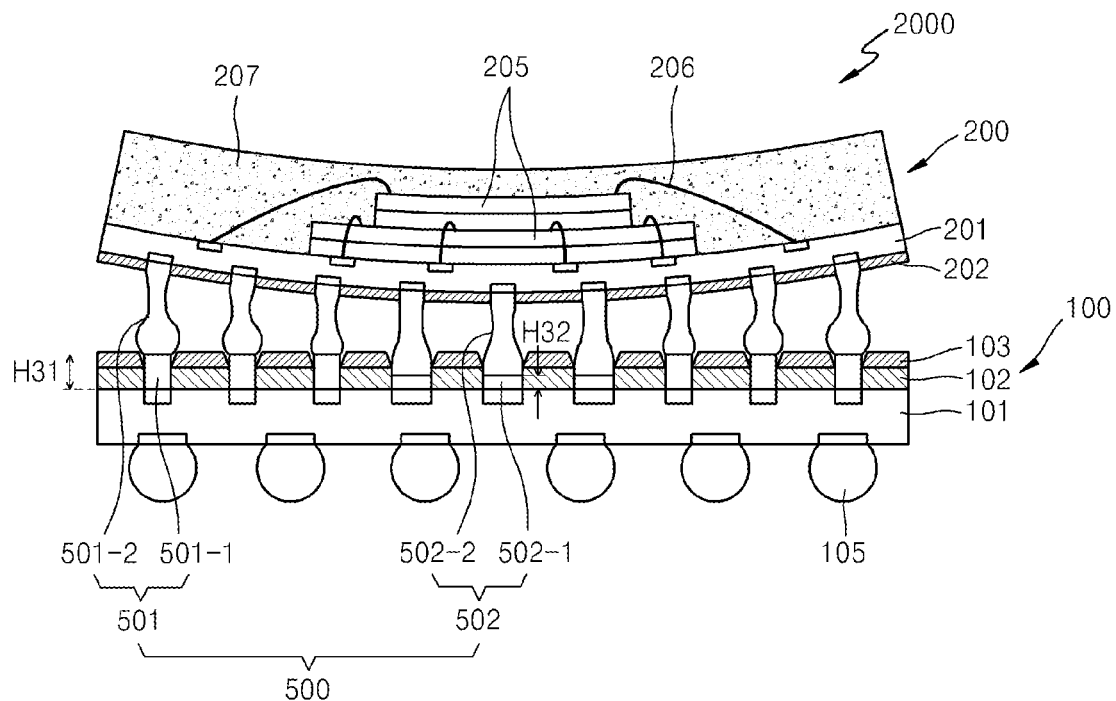
FIG. 15 is a cross-sectional view illustrating a semiconductor package apparatus according to example embodiments of inventive concepts.

FIG. 15 is a cross-sectional view illustrating a semiconductor package apparatus 2000 according to example embodiments of inventive concepts.

As illustrated in FIG. 15, the first signal transmission member 501 of the semiconductor package apparatus 2000 according to example embodiments of inventive concepts may include a first bump 501-1 having a relatively high first height H31 and a first shoulder unit 501-2 installed on the first bump 501-1.

Furthermore, the second signal transmission bump 502 may include a second bump 502-1 having a second height H32 that is relatively lower than the first height H31, and a second shoulder unit 502-2 installed on the second bump 502-1.

Figure 17:
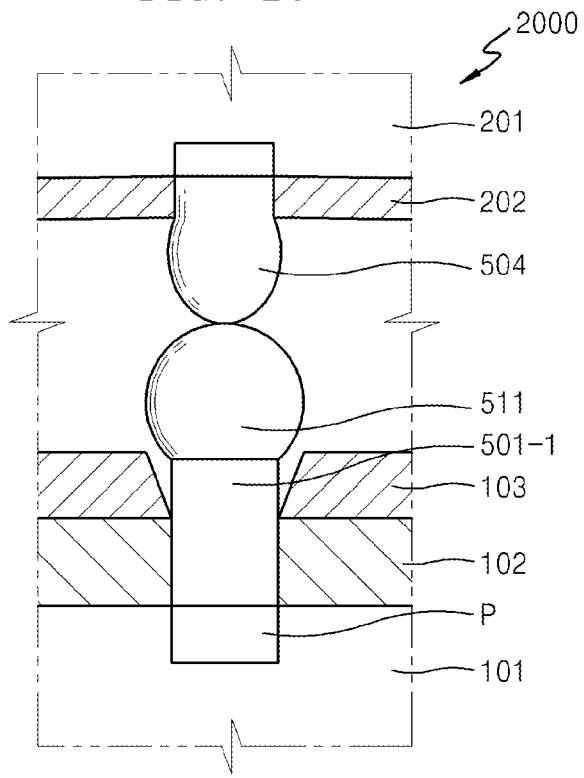
FIG. 17 is an enlarged cross-sectional view illustrating a state before a reflow process of FIG. 15.
Figure 18:
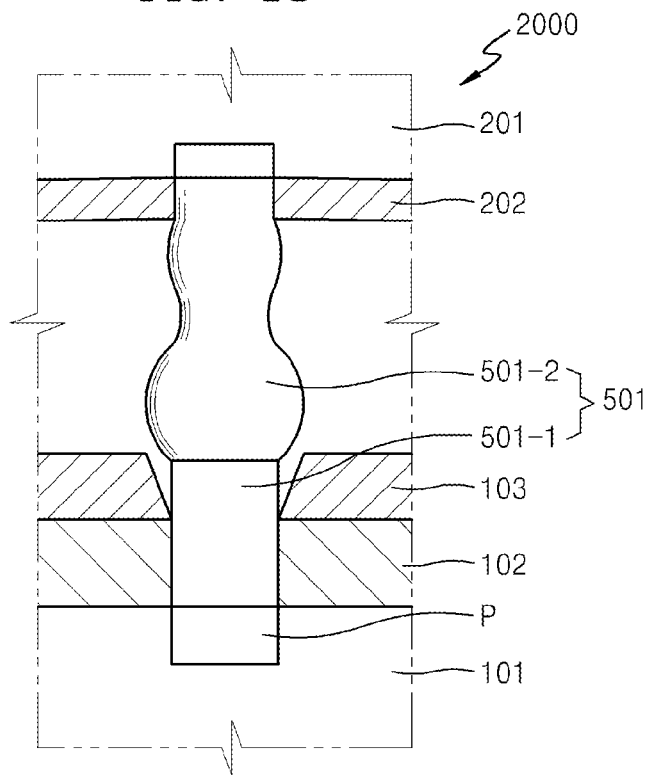
FIG. 18 is an enlarged cross-sectional view illustrating a state after the reflow process of FIG. 17.

FIG. 17 is an enlarged cross-sectional view illustrating a state before a reflow process of the semiconductor package apparatus 2000 of FIG. 15, and FIG. 18 is an enlarged cross-sectional view illustrating a state after the reflow process of FIG. 17.

That is, the first signal transmission member 501 of FIG. 15 may be formed as the first signal transmission member 501 in a solder column form of FIG. 18 by a reflow bonding of the first solder ball 511 installed on the upper part of the first bump 501-1 of FIG. 17 formed on an upper part of the first substrate 101 of the first semiconductor package 100 with the solder ball 504 of FIG. 17 formed on a lower part of the second substrate 201 of the second semiconductor package 200. Here, the second signal transmission member 502 of FIG. 15 may also be formed by a reflow bonding process illustrated in FIGS. 17 and 18.

Furthermore, the height of the first signal transmission member 501 in a solder column form of FIG. 18 may increase as the first height H31 of the first bump 501-1 increases.

The first bump 501-1 and the second bump 501-2 may be formed on a pad P of the first substrate 101 of the first semiconductor package 100, and may be made of copper (Cu) which is the same as that of the circuit layer formed on the upper part of the first substrate 101. Furthermore, the first bump 501-1 and the second bump 501-2 may be made of lead (Pb), tin (Sn), silver (Ag), aluminum (Al), etc as well as copper (Cu), and the shape may be a ball, a polygonal prism, a polyhedron, a poly curved surface, a complex curved surface, etc. as well as a column. However, the first bump 501-1 and the second bump 501-2 are not limited to the above materials and shapes.

Figure 16:
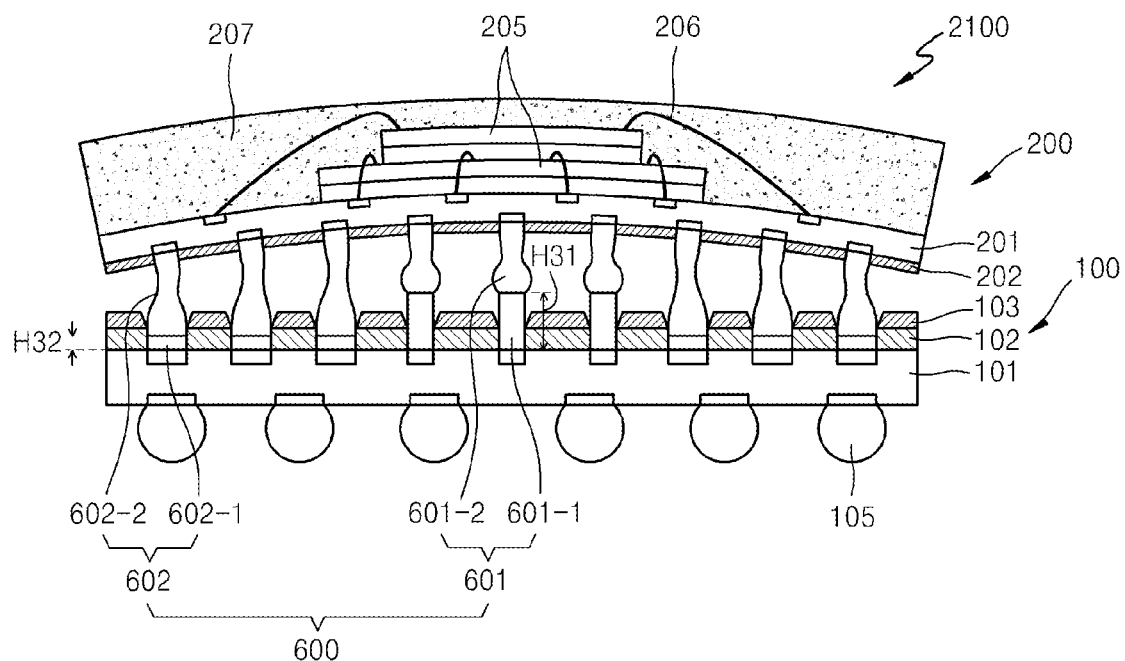
FIG. 16 is a cross-sectional view illustrating a semiconductor package apparatus according to example embodiments of inventive concepts.

FIG. 16 is a cross-sectional view illustrating a semiconductor package apparatus 2100 according to example embodiments of inventive concepts.

As illustrated in FIG. 16, a first signal transmission member 601 of the semiconductor package apparatus 2100 according to example embodiments of inventive concepts may include a first bump 601-1 having a relatively high first height H31, and a first shoulder unit 601-2 installed on the first bump 601-1.

Furthermore, a second signal transmission member 602 may include a second bump 602-1 having a second height H32 that is smaller than the first height H31, and a second solder unit 602-2 installed on the second bump 602-1.

Here, the first signal transmission member 601 and the second signal transmission member 602 may also be formed by the reflow bonding process illustrated in FIGS. 17 and 18.

Figure 19:
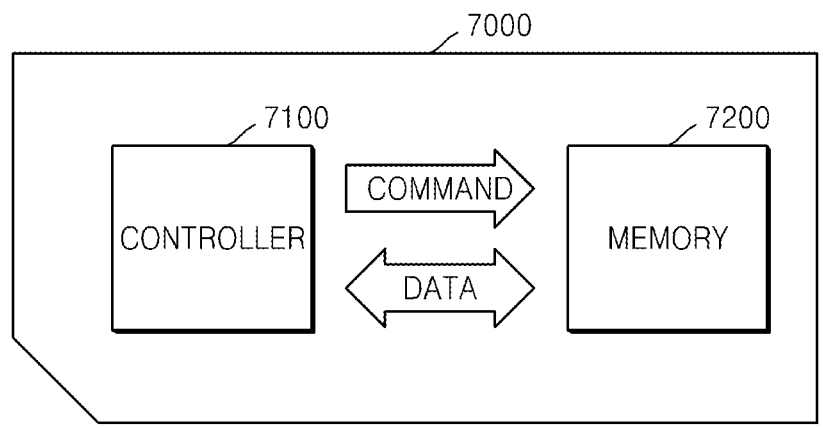
FIG. 19 is a block diagram schematically illustrating a memory card including a semiconductor package apparatus according to example embodiments of inventive concepts.

FIG. 19 is a block diagram schematically illustrating a memory card 7000 including a semiconductor package apparatus according to example embodiments of inventive concepts.

As illustrated in FIG. 19, a controller 7100 and a memory 7200 may be placed to exchange electric signals in the memory card 7000. For example, if a command is provided by the controller 7100, the memory 7200 may transmit data. The controller 7100 and/or the memory 7200 may include a semiconductor package apparatus according to example embodiments of inventive concepts. For example, the semiconductor chip 104 discussed previously with respect to FIGS. 4-6, and 8 may include the controller 7100 and the semiconductor chip 205 discussed previously with regard to FIGS. 4-5, 8, 11-12, and 15-16 may include the memory 7200. However, example embodiments are not limited thereto. The memory 7200 may include a memory array (not shown) or a memory array bank (not shown).

The memory card 7000 may be used as a memory device such as a memory stick card, a smart media card (SM), a secure digital (SD) card, a mini secure digital (mini SD) card, or a multimedia card (MMC).

Figure 20:
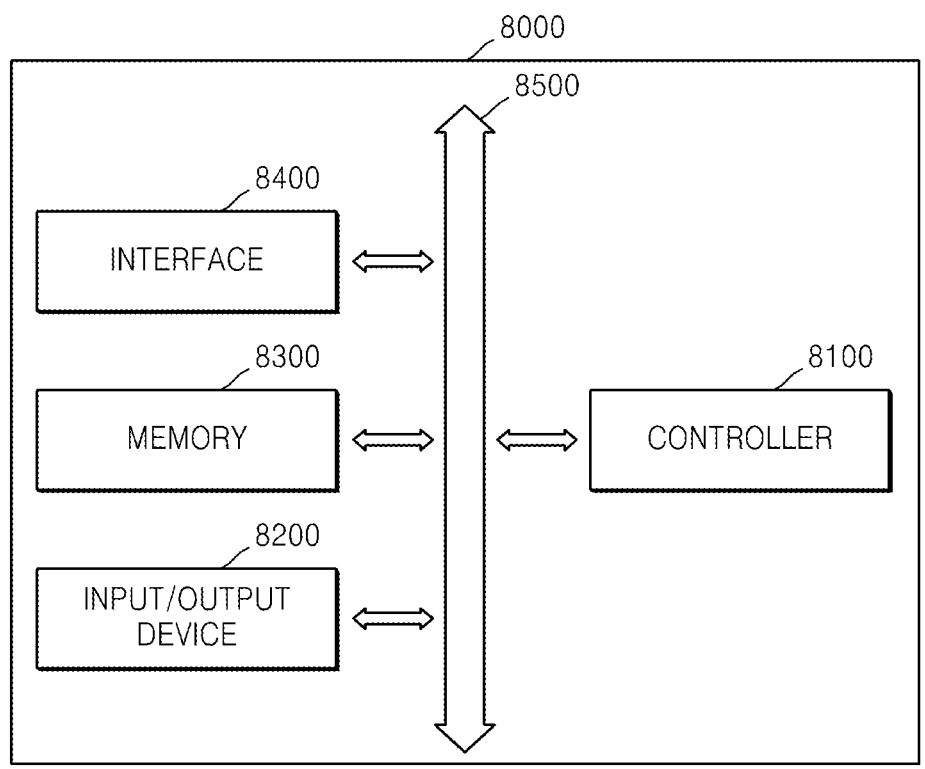
FIG. 20 is a block diagram schematically illustrating an electronic system including a semiconductor package apparatus according to example embodiments of inventive concepts.

FIG. 20 is a block diagram schematically illustrating an electronic system 8000 including a semiconductor package apparatus according to example embodiments of inventive concepts.

As illustrated in FIG. 20, the electronic system 8000 may include a controller 8100, an input/output device 8200, a memory 8300, and an interface 8400. The electronic system 8000 may be a mobile system and a system that transmits or receives information. The mobile system may be a personal digital assistant (PDA), a portable computer, a web tablet, a wireless phone, a mobile phone, a digital music player, or a memory card.

Here, the controller 8100 may execute a program and may control the electronic system 8000. The controller 8100 may be a microprocessor, a digital signal processor, a microcontroller, or a device similar thereto. Further, the input/output device 8200 may be used in inputting or outputting data of the electronic system 8000.

Furthermore, the electronic system 8000 may be connected to an external device such as a personal computer or a network using the input/output device 8200, and may exchange data with the external device. The input/output device 8200 may be, for example, a keypad or a keyboard. The memory 8300 may store codes and/or data for operation of the controller 8100, and/or may store data processed in the controller 8100. The controller 8100 and the memory 8300 may include a semiconductor package apparatus according to example embodiments of inventive concepts. For example, the semiconductor chip 104 discussed previously with respect to FIGS. 4-6, and 8 may include the controller 8100 and the semiconductor chip 205 discussed previously with regard to FIGS. 4-5, 8, 11-12, and 15-16 may include the memory 8300. However, example embodiments are not limited thereto. Furthermore, the interface 8400 may be a data transmission path between the system 8000 and another external device. The controller 8100, the input/output device 8200, the memory 8300, and the interface 8400 may mutually communicate through a bus 8500.

For example, the electronic system 8000 may be applied to a mobile phone, an MP3 player, a navigation system, a portable multimedia player (PMP), a solid state disk (SSD), or a household appliance.

FIGS. 21A to 21D are cross-sectional views illustrating semiconductor package apparatuses according to example embodiments of inventive concepts.

Figure 21A:
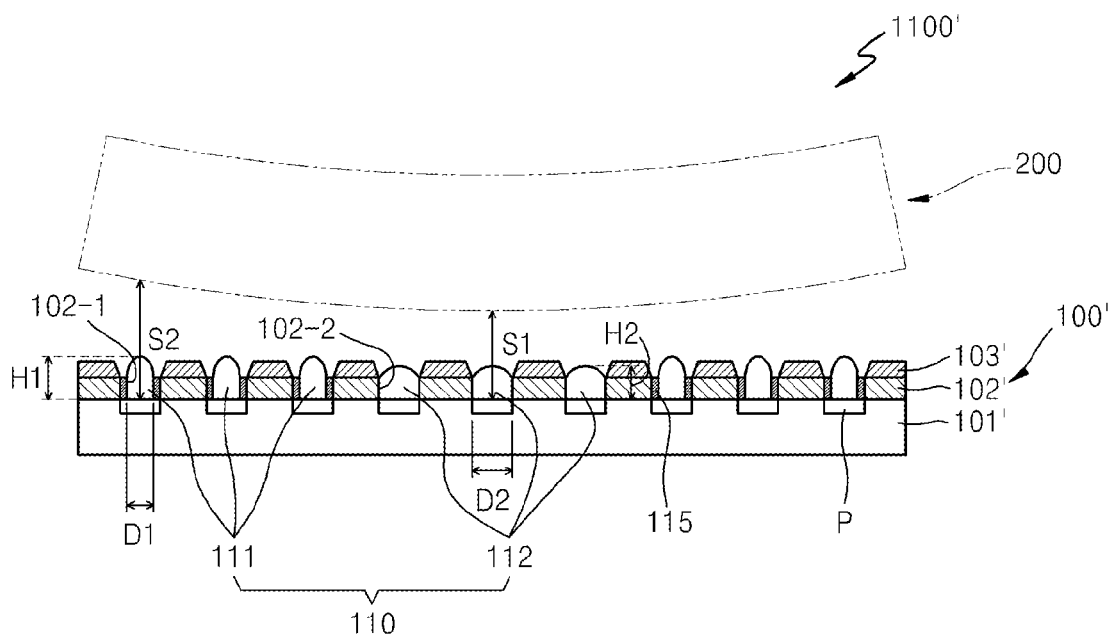
FIGS. 21A to 21D are cross-sectional views illustrating semiconductor package apparatuses according to example embodiments of inventive concepts.

Referring to FIG. 21A, a semiconductor package apparatus according to example embodiments 1100' may be similar to the semiconductor package apparatus 1100 described previously in FIG. 2. However, as shown in FIG. 21A, the first semiconductor package 100' may include equally sized pads P in the first substrate 101'. Additionally, the semiconductor package apparatus 1100' may include a first resist pattern 102' and a first sealing member 103' having holes with equally-sized diameters. A spacer pattern 115 may be formed between exposed sidewalls of the first resist layer 102' to form the first openings 102-1 having the first diameter D1 where the first solder balls 111 are formed.

Figure 21B:
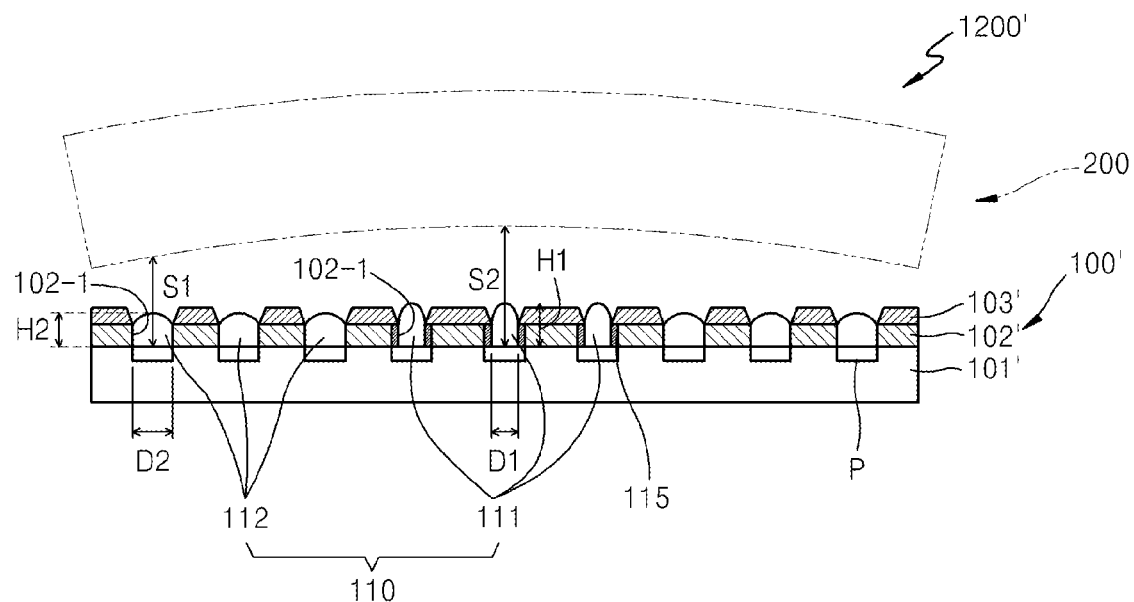

Referring to FIG. 21B, a semiconductor package apparatus according to example embodiments 1200' may be similar to the semiconductor package apparatus 1200 described previously in FIG. 3. However, as shown in FIG. 21B, the first semiconductor package 100' may include equally sized pads P in the first substrate 101'. Additionally, the semiconductor package apparatus 1200' may include a first resist pattern 102' and a first sealing member 103' having holes with equally-sized diameters. A spacer pattern 115 may be formed between exposed sidewalls of the first resist layer 102' to form the first openings 102-1 having the first diameter D1 where the first solder balls 111 are formed.

Figure 21C:
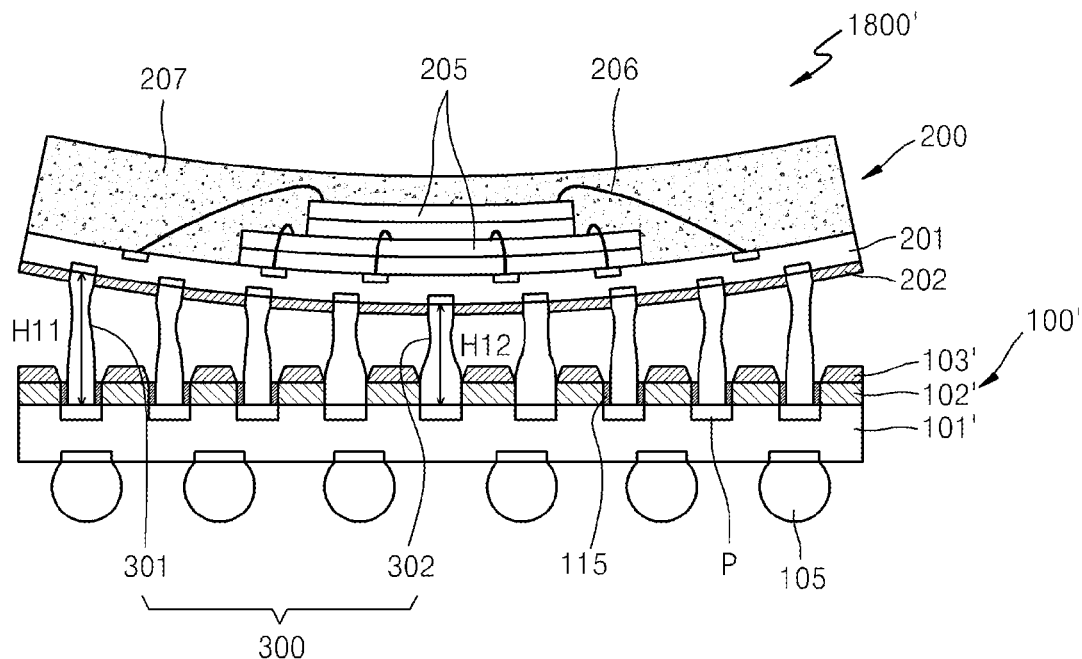

Referring to FIG. 21C, a semiconductor package apparatus according to example embodiments 1800' may be similar to the semiconductor package apparatus 1200 described previously in FIG. 11. However, as shown in FIG. 21C, the first semiconductor package 100' may include equally sized pads P in the first substrate 101'. Additionally, the semiconductor package apparatus 1800' may include a first resist pattern 102' and a first sealing member 103' having holes with equally-sized diameters. A spacer pattern 115 may be formed between exposed sidewalls of the first resist layer 102' to form the first openings where the first signal transmission members 301 are formed.

Figure 21D:
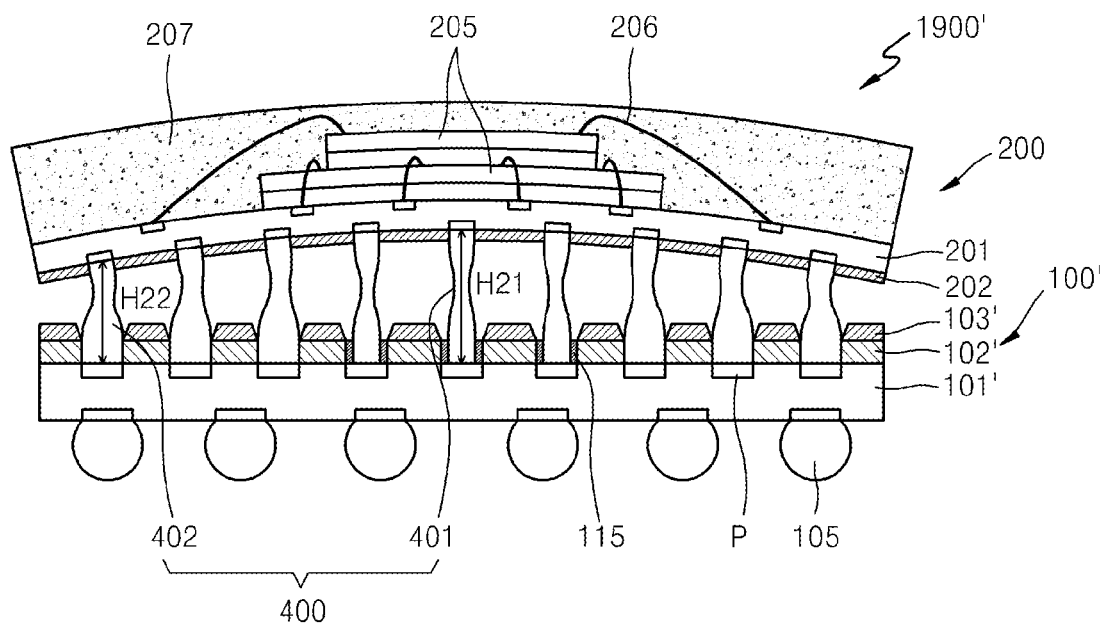

Referring to FIG. 21D, a semiconductor package apparatus according to example embodiments 1200' may be similar to the semiconductor package apparatus 1200 described previously in FIG. 3. However, as shown in FIG. 21D, the first semiconductor package 100' may include equally sized pads P in the first substrate 101'. Additionally, the semiconductor package apparatus 1200' may include a first resist pattern 102' and a first sealing member 103' having holes with equally-sized diameters. A spacer pattern 115 may be formed between exposed sidewalls of the first resist layer 102' to form the first openings where the first signal transmission members 401 are formed.

While some example embodiments have been particularly shown and described, it will be understood by one of ordinary skill in the art that variations in form and detail may be made therein without departing from the spirit and scope of the claims.

What is claimed is:

1. A semiconductor package apparatus comprising:
    a first semiconductor package including,
        a first substrate, the first substrate including a chip-mounting area at a central portion and a peripheral area surrounding the chip-mounting area,
        a first solder resist layer on the first substrate, and a first sealing member that covers and protects the first solder resist layer,
        the first sealing member defining holes; and
    a plurality of solder balls on the first substrate,
        the plurality of solder balls including a first solder ball having a first height and a second solder ball having a second height that is different from the first height, both the first solder ball and the second solder ball being on top of the peripheral area, and the plurality of solder balls being exposed by the holes of the first sealing member.

2. The semiconductor package apparatus of claim 1, wherein the first solder resist layer includes a first opening having a first diameter and a second opening having a second diameter, and the second diameter is different than the first diameter.

3. The semiconductor package apparatus of claim 2, wherein the first solder resist layer further includes a third opening having a third diameter, the third diameter is different than the first diameter and the second diameter, the plurality of solder balls further includes a third solder ball having a third height that is different from the first height and the second height, and the third solder ball is in the third opening.

4. The semiconductor package apparatus of claim 1, further comprising:

a second semiconductor package on the first semiconductor package.

5. The semiconductor package apparatus of claim 4, wherein the first opening has a first diameter, the second opening has a second diameter, the second diameter is larger than the first diameter, the first solder ball has a first height, the second solder ball has a second height, the second height is smaller than the first height, the first solder ball is in the first opening close to an edge part of the first substrate, and the second solder ball is in the second opening close to the central portion of the first substrate.

6. The semiconductor package apparatus of claim 4, wherein the first opening has a first diameter, the second opening has a second diameter, the second opening is larger than the first diameter, the first solder ball has a first height, the second solder ball has a second height, the second height is smaller than the first height, and the first solder ball is in the first opening close to a center the central portion of the first substrate, and the second solder ball is in the second opening close to an edge part of the first substrate.

7. The semiconductor package apparatus of claim 1, further comprising:

a semiconductor chip on the first substrate, wherein the plurality of solder balls on the first substrate are arranged in a rectangular ring shape, and the plurality of solder balls on the first substrate surround all sides of the first semiconductor chip.

8. The semiconductor package apparatus of claim 7, wherein the first solder ball is at a corner edge portion of the rectangular ring shape, and the second solder ball is at a central straight portion of the rectangular ring shape.

9. The semiconductor package apparatus of claim 1, wherein the first solder resist layer includes a first angled opening having a first inclined angle and a second angled opening having a second inclined angle, and the second inclined angle is different from the first inclined angle.

10. The semiconductor package apparatus of claim 1, wherein the first solder resist layer includes a first layer having a first thickness and a second layer having a second thickness, the second thickness is different than the first thickness, the first layer defines a first opening, and the second layer defines a second opening.

11. The semiconductor package apparatus of claim 1, wherein the first solder ball and the second solder ball are exposed by the holes of the first sealing member.

12. A semiconductor package apparatus comprising:

a first semiconductor package including, a first substrate, a first solder resist layer on the first substrate, and a first sealing member that covers and protects the first solder resist layer, the first sealing member defining holes;

a plurality of solder balls on the first substrate, the plurality of solder balls including a first solder ball having a first height and a second solder ball having a second height that is different from the first height, and the plurality of solder balls being exposed by the holes of the first sealing member; and a second semiconductor package on the first semiconductor package, the second semiconductor package including, a second substrate, a second solder resist layer on the second substrate, the second solder resist layer defining a plurality of openings having equal diameters, and a plurality of other solder balls on the second substrate, the plurality of other solder balls having equal diameters and being located on the second substrate, and the plurality of other solder balls corresponding to the plurality of solder balls on the first substrate.

13. The semiconductor package apparatus of claim 12, wherein one of the plurality of other solder balls is on top of the first solder ball and adjacent to the first solder ball, and an other one of the plurality of other solder balls is on top of the second solder ball and adjacent to the second solder ball.

* * * * *